(12) United States Patent
Hao et al.

(10) Patent No.: US 7,692,497 B2
(45) Date of Patent: Apr. 6, 2010

(54) PLLS COVERING WIDE OPERATING FREQUENCY RANGES

(75) Inventors: Jianbin Hao, San Jose, CA (US); Ning Zhu, San Jose, CA (US); Yanjing Ke, Union City, CA (US)

(73) Assignee: Analogix Semiconductor, Inc., Santa Clara, CA (US)

( * ) Notice: Subject to any disclaimer, the term of this patent is extended or adjusted under 35 U.S.C. 154(b) by 149 days.

(21) Appl. No.: 11/707,778

(22) Filed: Feb. 12, 2007

(65) Prior Publication Data

US 2008/0191760 A1  Aug. 14, 2008

(51) Int. Cl.
*H03L 7/00* (2006.01)

(52) U.S. Cl. .............................. 331/16; 331/17; 331/25; 331/36 C; 331/177 V; 331/179

(58) Field of Classification Search ................. 331/1 A, 331/10, 14–18, 25, DIG. 2; 327/162–163, 327/156–159; 375/373–376
See application file for complete search history.

(56) References Cited

U.S. PATENT DOCUMENTS

| | | | |
|---|---|---|---|
| 4,590,602 A | | 5/1986 | Wolaver |
| 5,389,898 A | | 2/1995 | Taketoshi et al. |
| 5,648,744 A | * | 7/1997 | Prakash et al. ................. 331/11 |
| 5,686,864 A | | 11/1997 | Martin et al. |
| 5,736,904 A | | 4/1998 | Humphreys et al. |
| 5,783,972 A | | 7/1998 | Nishikawa |
| 6,256,362 B1 | | 7/2001 | Goldman |
| 6,313,707 B1 | | 11/2001 | Fischer et al. |
| 6,326,826 B1 | | 12/2001 | Lee et al. |
| 6,424,229 B1 | * | 7/2002 | Justice et al. ................. 331/4 |
| 6,624,675 B2 | | 9/2003 | Neron |

(Continued)

FOREIGN PATENT DOCUMENTS

EP    1 662 664 A1    5/2006

(Continued)

OTHER PUBLICATIONS

International Search Report and Written Opinion of the International Searching Authority Dated Jul. 14, 2008, International Application No. PCT/US2008/001127.

*Primary Examiner*—Vibol Tan
*Assistant Examiner*—Christopher Lo
(74) *Attorney, Agent, or Firm*—Blakely Sokoloff Taylor & Zafman LLP

(57) ABSTRACT

The present invention provides a method and mechanism for adapting a single phase-locked loop (PLL) for a wider range of frequencies than has been possible with prior art solutions. An analog comparator circuit that senses the output of a charge pump and provides a signal to a digital control circuit to choose a suitable load circuit for the PLL voltage controlled oscillator (VCO). The analog comparator with the digital control circuit changes the VCO loads to select the best VCO range to achieve the incoming signal frequency lock. A single PLL with the VCO load selection method disclosed, with use of built-in hysteresis, in addition to the phase and frequency feedback of the prior art, allows multiple overlapping frequency ranges to be covered in a stable fashion. This enables frequency locking of the PLL over a wide range of frequencies with a small die size and low power consumption.

8 Claims, 5 Drawing Sheets

U.S. PATENT DOCUMENTS

| | | | |
|---|---|---|---|
| 6,774,732 B1 | 8/2004 | Harnishfeger et al. | |
| 7,019,595 B1 * | 3/2006 | Lo et al. | 331/16 |
| 7,023,251 B2 | 4/2006 | Starr | |
| 7,127,017 B1 | 10/2006 | Evans et al. | |
| 7,127,022 B1 | 10/2006 | Dieguez | |
| 7,355,485 B2 * | 4/2008 | Gomez | 331/15 |
| 7,408,415 B2 * | 8/2008 | Dielt et al. | 331/16 |
| 7,432,768 B2 * | 10/2008 | Han et al. | 331/16 |
| 2005/0057289 A1 | 3/2005 | Pham | |
| 2005/0110537 A1 | 5/2005 | Wurzer | |
| 2005/0110580 A1 | 5/2005 | Lee | |
| 2005/0253658 A1 | 11/2005 | Maeda et al. | |
| 2006/0038620 A1 | 2/2006 | Drapkin et al. | |
| 2006/0197614 A1 | 9/2006 | Roubadia et al. | |
| 2006/0214737 A1 | 9/2006 | Brown et al. | |
| 2006/0226916 A1 | 10/2006 | Florescu et al. | |
| 2006/0255872 A1 | 11/2006 | Hino | |
| 2006/0258312 A1 | 11/2006 | Uozumi et al. | |

FOREIGN PATENT DOCUMENTS

| | | | |
|---|---|---|---|
| WO | WO-02/073789 A1 | 9/2002 | |

* cited by examiner

PLLS COVERING WIDE OPERATING FREQUENCY RANGES

BACKGROUND OF THE INVENTION

1. Field of the Invention

The present invention relates to the High Definition Multimedia Interface (HDMI) operation, and specifically to the automatic PLL (phase locked loop) control to lock to the input reference clock over a wide frequency range.

2. Prior Art

Any High Definition Multimedia Interface (HDMI) receiver must support an input reference clock frequency range of 25 MHz to 165 MHz. The input can be within this frequency range without providing prior knowledge to the receiver. It is necessary for the receiver to provide a PLL that can lock to the input clock frequency and generate the required output frequencies.

It has not been possible to operate a single PLL over this very wide frequency range in the past. Typically it cannot be done with a single prior art PLL design, as it is difficult to have such a wide frequency range in a tuned load circuit with the necessary gain. Since it is difficult to design a PLL which can generate such a large output clock frequency range, it has been necessary to use multiple PLLs to cover the required range, with each PLL in the group covering a portion of the required range.

A typical prior art PLL uses a frequency and phase comparator to provide input to a charge pump which generates an analog voltage output that is used to control the VCO frequency within the range of the tunable load. This generated frequency is expected to be an estimate of the input frequency which is lockable within the bandwidth of the PLL load used. Since the tuning range of each PLL is relatively small, the prior art uses multiple PLLs with overlapping frequency ranges to cover the total required frequency range of HDMI. This is silicon area consuming, and costly. It also results in higher power consumption as PLLs have to be enabled to ensure coverage of frequency as well as a continuous lock.

FIG. 1 is a block diagram 100 of a typical prior art PLL implementation. The PLL comprises an input block for Frequency and Phase Sensing (FPS) 110, which typically comprises a phase and frequency detector and comparator (PFD) block 111 and a low pass filter (LPF) block 112, as shown. The output of FPS 110 is used to control a charge pump 120 having a voltage output that varies with the phase difference between the incoming reference frequency and a feedback frequency. Typically the reference frequency is a fraction of the needed output frequency 'F' by a factor 'N' (Ref freq=F/N where 'F' is the output frequency required and 'N' is an integer). The generated charge pump 120 voltage, in turn, controls a voltage controlled oscillator (VCO) 130. The VCO output is fed back to the PFD 111 through a frequency divider 140, which converts it to the lower frequency F/N. The frequency and phase of this feedback is compared with the frequency and phase of the reference frequency to achieve a lock when the PLL is operational. The VCO frequency can be varied within a small range to achieve the necessary frequency lock of the PLL. This range is limited by the gain and bandwidth of the load of the VCO.

In view of the limitations of the prior art, it would be therefore beneficial to provide a single PLL that would have a wide frequency range of operation, i.e., be able to lock on a wide range of input frequencies. It would be further advantageous if such wide range of frequencies would be suitable for operation over the HDMI frequency range using a single PLL.

DETAILED DESCRIPTION OF THE PREFERRED EMBODIMENTS

Figure 1:
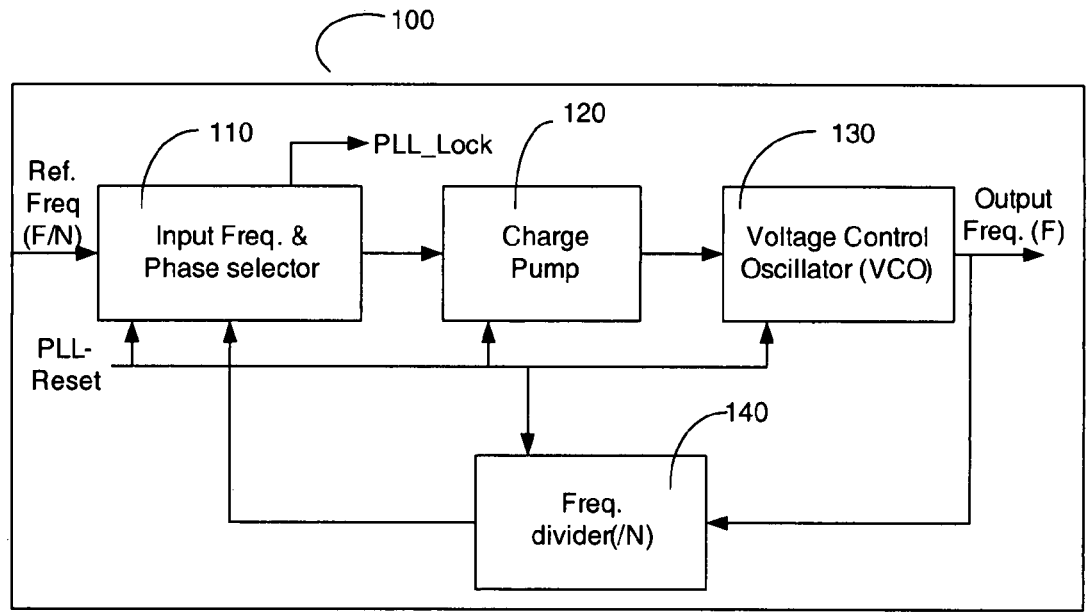
FIG. 1 is a block diagram of a prior art PLL.
Figure 2:
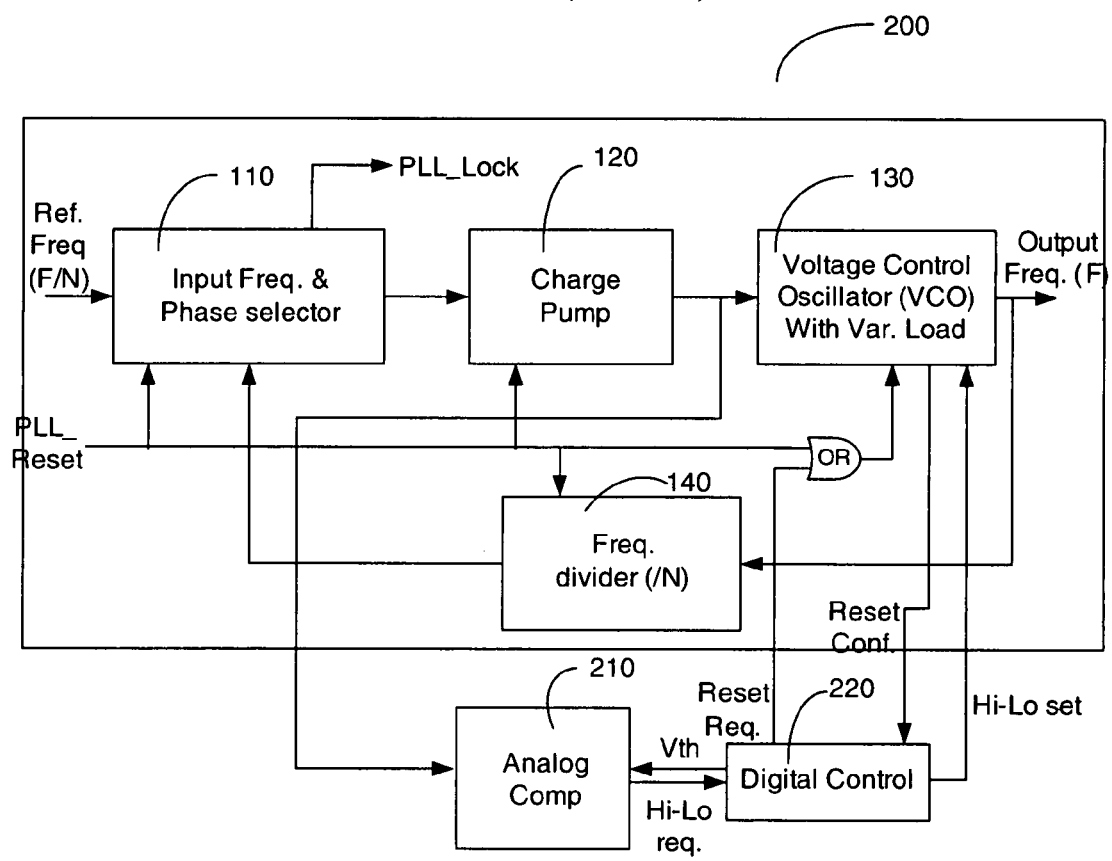
FIG. 2 is a block diagram of disclosed PLL.

FIG. 2 is a block diagram representation 200 of the non-limiting and exemplary implementation of the current disclosure. The present invention provides a method and mechanism for adapting a single phase-locked loop (PLL) for a wider range of frequencies than has been possible with prior art solutions. An analog comparator circuit 210 senses and compares the voltage output of the charge pump 120, to a pre-set threshold and outputs a signal to a digital control circuit 220, to choose a suitable load, from a multiplicity of tunable loads, for the PLL voltage controlled oscillator (VCO) 130. This analog comparator circuit 210 with the digital control circuit 220 is used to change the tunable load of the single VCO 130 and select the best VCO range provided by the switchable load to achieve lock to the incoming signal frequency. The use of a single PLL with the analog comparator 210 and digital control 220 to control the VCO 130 load selection, in addition to the phase and frequency feedback through the frequency divider block 140 of the prior art, allows multiple overlapping frequency ranges, enabled by the tunable loads, to be covered with one PLL. This use of single PLL reduces the die size and power consumption compared to a circuit implementation using multiple standard PLLs for the wider frequency range of operation. Hence new PLLs that are able to automatically sense and adjust the loading of the VCO, enabling them to operate over a wider range of frequencies, are disclosed in detail below. Specifically, this is done with analog comparators and digital control circuit added to the prior art PLL to allow switching of the load circuits based on the output of the charge pump. The pump voltage is used to choose the oscillation frequency range of the VCO that is able to lock to the input reference frequency.

Figure 4:
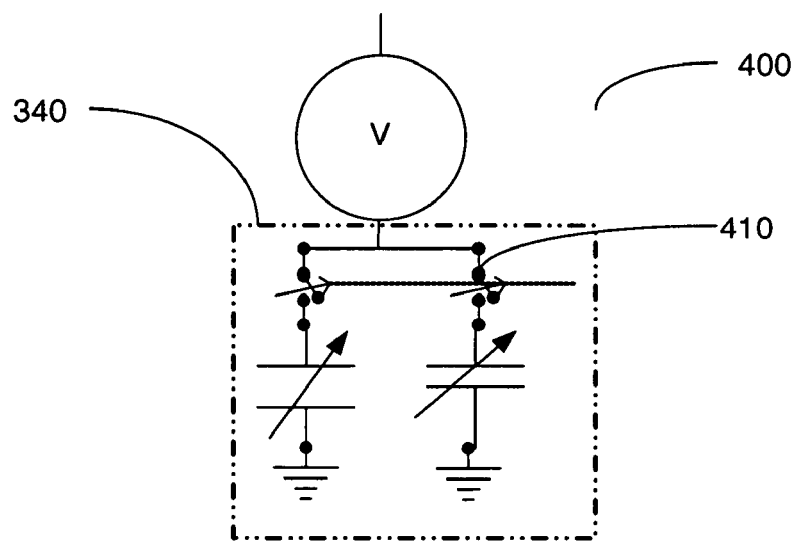
FIG. 4 is a diagram showing variable load for a wide frequency-range PLL.
Figure 6:
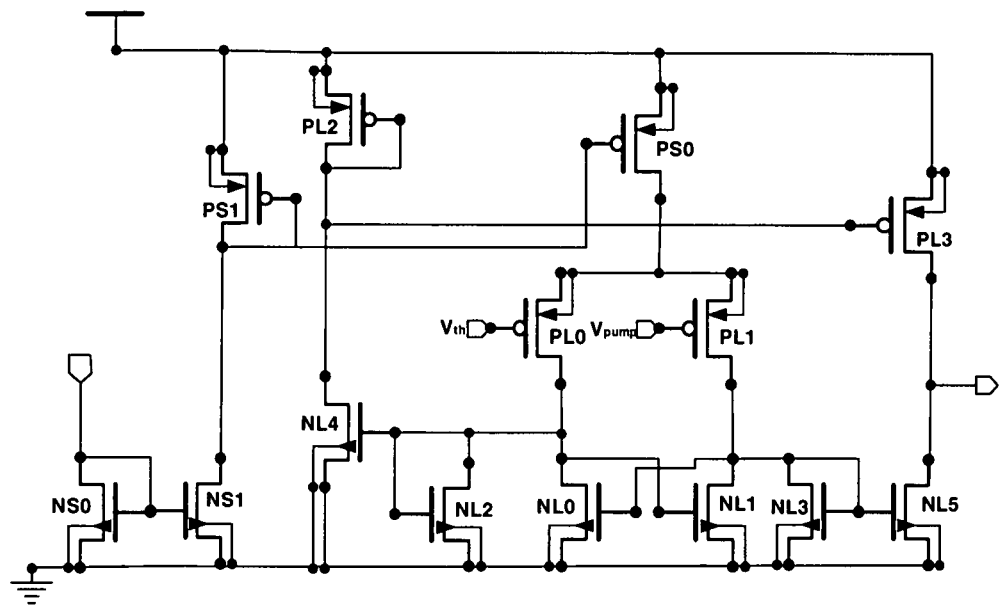
FIG. 6 is a circuit diagram of an analog comparator circuit.

In exemplary and non-limiting block diagram 200 of the disclosed PLL 200 shown in FIG. 2, In this embodiment, the analog comparator circuit 210 is a differential sensing circuit, shown in greater detail in FIG. 6. The analog comparator circuit 210 compares a preset threshold voltage "Vth", that is a function of the current operating frequency range, with the output voltage of the charge pump 120 "Vpump". An output signal based on the comparison is provided to the digital control unit 220. This signal is used by the digital control unit 220 to select the loading elements in the VCO 130 to support the required frequency range of operation. In the non-limiting exemplary implementation shown the control circuit 220 provides the comparator with the preset Vth value for the loading element selected. The variable load 340 of the VCO can be chosen from a multiplicity of tunable elements. FIG. 4 is a non-limiting example with two tunable elements 410a and 410b that can be the switchable load for VCO 130 per the disclosed invention. These load elements are switched in or out of the load circuit by the digital control circuit 220 using the switches 420a and 420b. These tunable load elements can be switched in individually or as a group to achieve the cover the lock frequency range of the PLL. The typical loading elements 410a and 410b can comprise of varactors (voltage controlled variable resistors) or variable capacitors that are part of a tuned circuit and are automatically brought in or out as the frequency changes. It is necessary to have sufficient frequency overlap between ranges that are selected by the digital control circuit to enable smooth operation of the PLL over the wider lock frequency range that is achievable using the load change in accordance with the disclosed invention.

Figure 3:
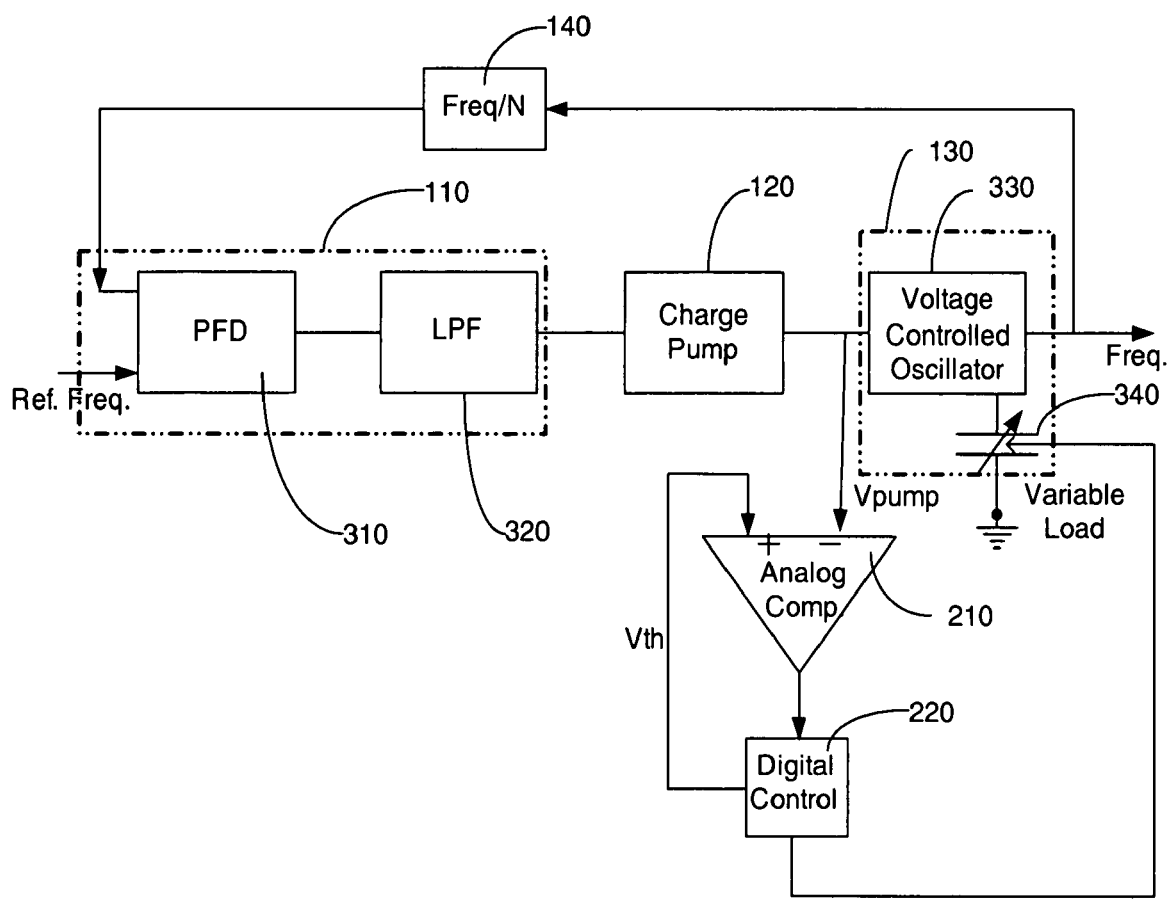
FIG. 3 is the working principle showing the analog comparator and digital control of the VCO load.
Figure 5:
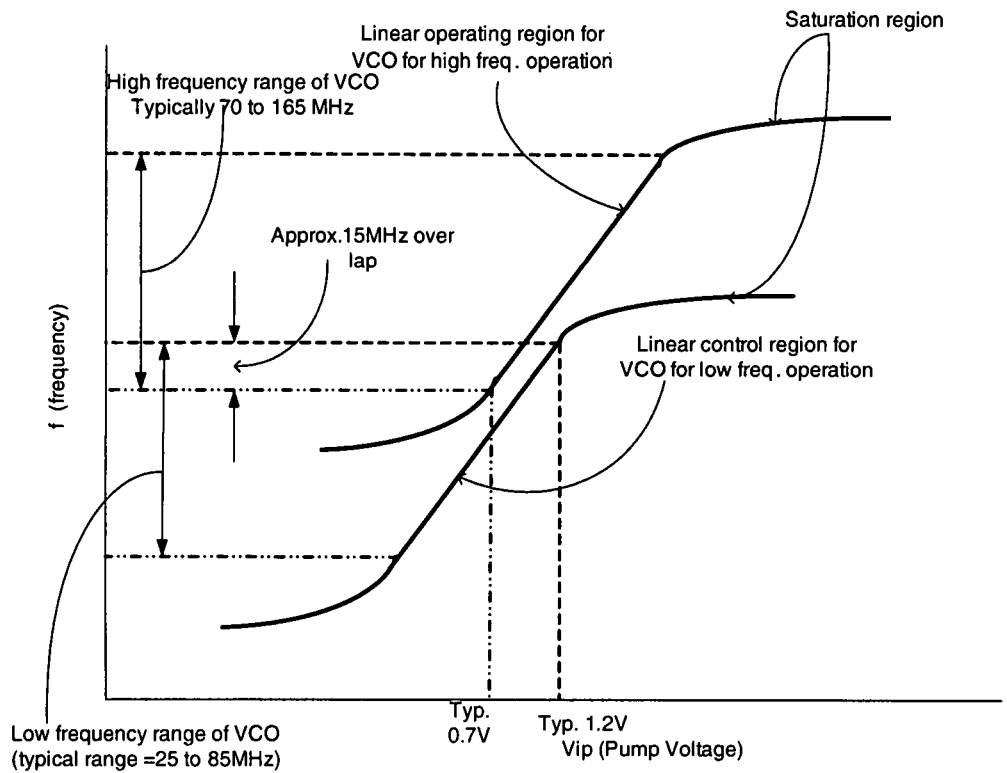
FIG. 5 is a frequency-voltage relationship graph of two selectable load ranges.

The working principles of the invention can be explained using the more detailed block diagram shown in FIG. 3. A low frequency of F/N, where F is the output frequency and N is an integer is transmitted by the transmitter as a reference frequency. This is used by the receiver to get a stable dynamic reference. The output of the VCO 130 is fed back through the frequency divider 140 and compared to the reference frequency in PFD 111. A low pass filter (LPF) 112 is used to filter the high frequency components of the output and is used as a control input to a charge pump 120. The charge pump 120 produces a voltage that is proportional to the difference in phase between the input reference and the feedback from the VCO 130. This voltage is used to tune the VCO 130, comprising the oscillator 330 and the load circuit 340. The load circuit comprise of multiple tunable loads that can be switched in as load of the VCO. The frequency is lockable within the tunable range of each load circuit or group of tunable load circuits simultaneously switched in as the load 340 for the VCO 130 to achieve frequency lock. Since the tuning range of a VCO is limited by the load circuit, the disclosed invention provides a method of changing the load of the VCO using a control signal based on the input reference frequency. This ability to automatically switch the tunable load circuits, based on the input reference, enable the PLL to lock over a wider range of frequencies. An exemplary and non-limiting multi-load circuit 400 is shown in FIG. 4. Based on pre-defined thresholds set as inputs to the analog voltage comparator 210, an output signal is generated which is used by the digital control circuit 220 to switch in the optimum load necessary to enable the PLL to lock to the incoming reference frequency. This automatic changeover of frequency ranges, based on the analog feedback, allows multiple overlapping frequency ranges to be smoothly covered by a single PLL configured in accordance with the disclosed invention. A typical Voltage-Frequency characteristic, used for the changeover of the load in a twin load system, is shown in FIG. 5. The analog comparator circuit 210 thresholds are preset in such a way as to provide sufficient frequency overlap of the frequency ranges to allow for smooth transition between the frequency ranges without instability of the output.

As the non limiting example two frequency control curves with thresholds are shown in FIG. 5 to explain the need for over-lap of the frequency ranges. The over lapping frequency enable the stable operation when the frequency goes up or down as explained below.

Assume the VCO initially operates on the low frequency range, on the low frequency curve of FIG. 5. If the input frequency moves higher, the out-put of the pump increases till the proportionate threshold reaches the set point of 1.2 V. Here the load switching occurs to the high frequency load allowing the VCO to operate on the high frequency curve of FIG. 5. This changes the VCO operation to the high frequency range. If the frequency now starts to come down the load switching does not occur when the pump voltage cross the 1.2V, but occurs only when the Pump voltage falls to 0.7V. This threshold difference provides the frequency overlap between the low and high frequency switching points. This is necessary to prevent continuous switching of the load (unstable condition)in the case where the VCO operates close to either the low to high frequency threshold or the high to low frequency threshold with some shifting in the incoming frequency. This exemplary and non-limiting setting of the thresholds with overlapping of frequency is as shown on the operating curves in FIG. 5, and provides a form of hysteresis, i.e., when one frequency range is exceeded, switching to the adjacent frequency range will result in stable operation within that adjacent frequency range.

An exemplary and non-limiting analog comparator circuitry is shown in FIG. 6. It compares the output of the charge pump 120 'Vpump' with the preset threshold 'Vth' that is a function of the current frequency range of the PLL, enabling the transitions between loads.

The typical operation of a twin load PLL is explained with respect to the example with two ranges, high and low, as shown in FIG. 5. In the example assume the initial frequency range to be the low frequency range and the PLL starts up in this range. If lock frequency is not achieved the charge pump voltage increases trying to achieve lock. The proportional input to the charge pump output "Vpump" is fed to one input of the comparator circuit at gate of PL1 in FIG. 6. A threshold "Vth", 1.2 V in this example, is input at the second input of the comparator circuit at the gate of PL0. The analog comparator circuit 210 in FIG. 3, the circuit diagram of which is shown in FIG. 6, provides an output from the differential source follower comprising the devices PL0, PL1, PS0, NL0, and NL1. The source follower has a unity gain output. This buffer with unity gain ensures that there is no real loading on the pump due to the sense amplifier. The output of this buffer is amplified by the amplifier stage PL3 and NL5 and is used to control the changeover of the load of the VCO to one that will allow a higher frequency range of operation. To prevent continuous switching between ranges, the two thresholds provided as "Vth" input have a frequency overlap as shown in FIG. 5. In this typical example when the VCO works in the low frequency range the "Vth" is set to 1.2V and when the VCO works in high frequency range the "Vth" is set to 0.7V. The output of the analog sensor goes to the digital control unit 220. The output of the digital control unit 220 controls the choice of load circuits of the VCO and hence its working range. The overlap of the two working ranges is about 15 Mhz in the example of FIG. 5. The switched load is shown in FIG. 3 with two switchable capacitors.

Figure 7:
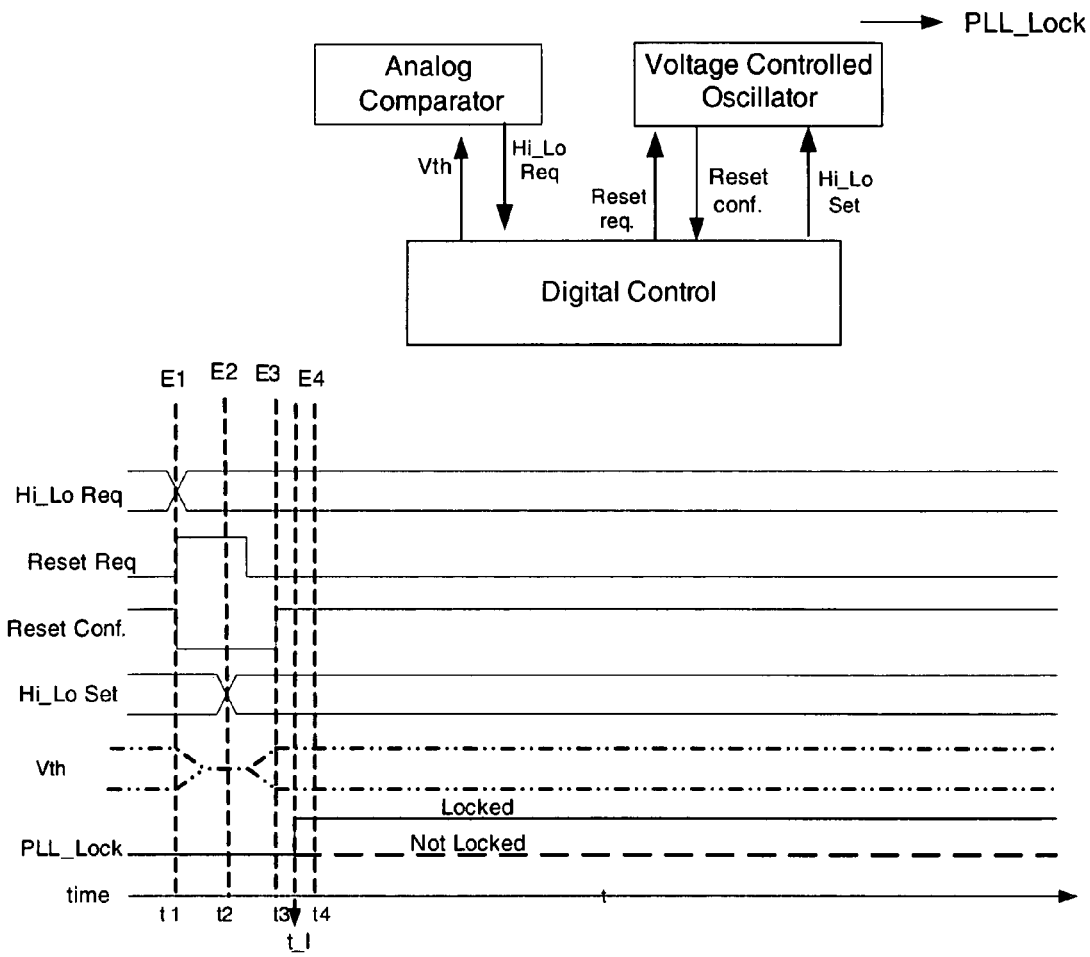
FIG. 7 is a PLL control and timing diagram showing the PLL control sequence.
Figure 8:
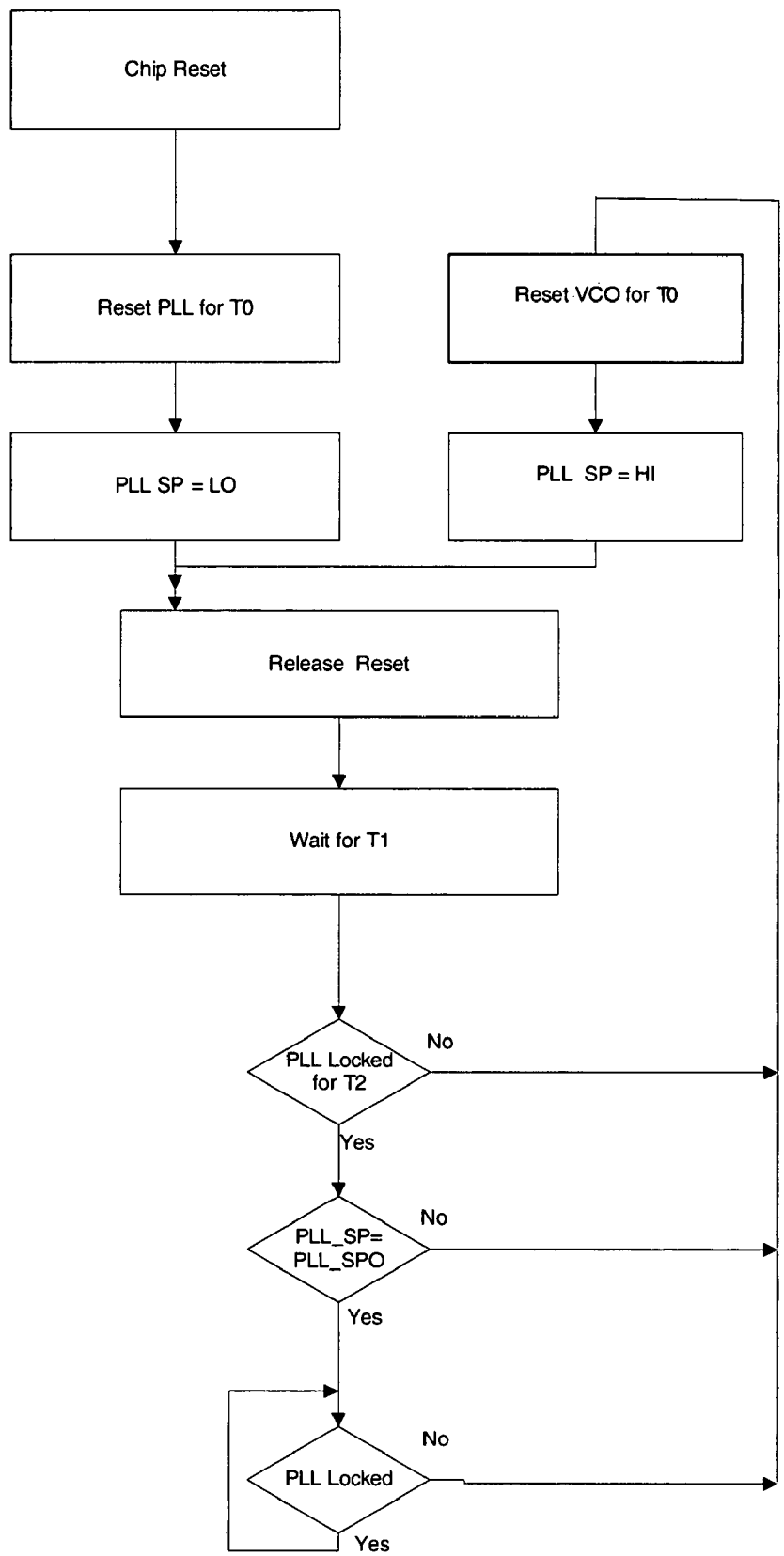
FIG. 8 is a flow diagram for the PLL frequency range control and reset control.

FIG. 7 shows the PLL control and timing diagram and FIG. 8 shows the flow diagram of operation. To simplify the circuit design of the exemplary example of the PLL in FIG. 3, the frequency range settings are allowed to change only during a reset period and a check for an updated frequency range is allowed only after the PLL frequency is stable as indicated by the PLL Lock signal, which is a signal that is output from the PLL to indicate that frequency and phase lock has been achieved between the input reference clock and output of the PLL. FIG. 7 shows the control signals and the timing sequence of setting the frequency range and checking for an updated frequency range. Referring to FIG. 7, PLL Reset is an active low reset signal generated from outside the PLL. The Reset Req is a reset request generated by the control block based on the signal from the comparator. Reset Req represents the request signal generated when a reset is needed for frequency range change. The VCO can be reset by the PLL-Reset request or the reset req. from the control block. Hi_Lo Req represents the frequency range indicator from the control block (1=high frequency range, 0=low frequency range); Hi_Lo Set represents the frequency range control signal to the VCO. The triggering event E1 represents a VCO reset at time t1.

At time t1 event E1 happens, that is, a signal indicating mismatch is produced by the comparator to the control circuit, triggering the Reset Req to the VCO; event E2 happens at time t2 after E1, at which time signal Hi_Lo Set is provided by the control circuit to the load to change the load to the next range necessary to match Hi_Lo Req; event E3 happens at time t3 after E2, at which time the reset for VCO is released; event E4 the completion of the tunable load change sequence happens at time t4. The PLL is allowed the time between Event E3 and E4 to achieve lock, which happens by time t_1 in FIG. 7. At time t4 the cycle restarts checking for frequency locked status, updated Hi_Lo Req and PLL unlock, or unknown state conditions again. The PLL does not change the status of the Hi_Lo Req's during PLL reset. The Control circuit provides the Vth value to the comparator based on the currently selected tunable load which defines the current frequency range of the VCO. This Vth value is pre-defined for each range and is stored in the control block.

When the receiver with the PLL is powered on, and system reset has been asserted, the initial Hi_Lo Req's values may be random, but the PLL needs to be set into a known state to start. So in this exemplary case the initialization of PLL puts it into a deterministic value which is set to 'low'.

Referring to FIG. 8, PLL_SP, that takes values of Hi or Lo, is the control input for the PLL's frequency range; PLL_SP0 is the PLL's ideal frequency range indicator based on the comparison results between the charge pump output and the pre-defined voltage high and low threshold; PLL_Lock is an output indicating that the PLL_SP and PLL_SP0 are within an acceptable tuning range of the connected load of the VCO and have achieved frequency lock between the input reference and the output frequency. This Lock signal is an indicator from PLL which is a necessary condition indicating that the PLL is working properly. PLL_RESET is the reset control input to PLL. This is asserted at start. Reset Req. is the signal from the control block to reset the VCO. t0, t1, t2 and t3 are various periods of time. In the exemplary implementation, PLL locked signal transitions, if the system achieves lock state, between the time periods t3 and t4, as shown at time t_1. The PLL is in lock and operating correctly as long as the PLL_Lock signal is asserted by the PLL. When the input frequency change happens, the PLL will lose the lock and the process of re-establishing lock is repeated.

What is claimed is:

1. A phase locked-loop (PLL) capable of providing continuous frequency lock over a wide range of frequencies comprising:
   a reference frequency input;
   a sensing component coupled to compare the phase and frequency of the reference frequency input and a feedback frequency responsive to an output of the PLL;
   a low frequency filter (LF) driven by an output of the sensing component;
   a charge pump controlled solely by an output of the LF;
   a single voltage controlled oscillator (VCO) coupled to an output of the charge pump, the voltage controlled oscillator being coupled to a tunable variable load;
   the tunable variable load being comprised of a plurality of variable capacitors selected by load switches that are responsive to a control signal, each variable capacitor being tunable to cover a range of frequencies such that the range of frequencies is greater than the range of frequencies covered by any one variable capacitor;
   a comparator coupled to compare the output of the charge pump to a threshold voltage provided by a control unit;
   the control unit coupled to generate the control signal responsive to the output of the comparator and the threshold voltage responsive of the tunable variable load used;
   the high end of frequencies covered by each tunable variable load being overlapped by the low end range of frequencies covered by any tunable variable load covering the next higher range of frequencies and the low end of frequencies covered by any tunable variable load being over lapped by the high end range of frequencies covered by the any tunable variable load covering the next lower range of frequencies;
   the control unit, when switching the load switches from a first tunable variable toad covering a first range of frequencies to a second tunable variable load covering the next higher adjacent range of frequencies, causing the switching to occur at a higher frequency than when switching from the second tunable variable load to the first tunable variable load;
   enabling the PLL to operate with stability and in continuity over the fill range of frequencies covered by the VCO and the charge pump being indifferent to the variable load of the VCO.

2. The PLL of claim 1, wherein the comparator is an analog comparator.

3. The PLL of claim 1, wherein the control unit is a digital control unit.

4. The PLL of claim 1, wherein the threshold voltage is determined based on the current frequency range of the VCO.

5. An integrated circuit comprising the PLL of claim 1.

6. A Phase-locked loop (PLL) comprising:
   a frequency and phase sensor and comparator that compares an input reference frequency with a feedback signal responsive to the output of the PLL;
   a low frequency filter (LF) driven by an output of the frequency and phase sensor and comparator;
   a charge pump controlled solely by an output of the LF;
   a single voltage controlled oscillator (VCO) coupled to the charge pump and to a plurality of tunable loads, each of the tunable loads capable of being switched in or out in an uninterrupted fashion by a switching signal provided by a digital control unit responsive to the output of an analog comparator and a tunable variable, each of the tunable loads being a tunable variable load covering a specific frequency range within a total frequency range covered by the PLL;
   the analog comparator for comparing a analog high voltage output from the charge pump of the PLL with a threshold voltage value provided by said digital control unit; and,
   the digital control unit, when switching the load switches from a first tunable variable load covering a first range of frequencies to a second tunable variable load covering the next higher adjacent range of frequencies, causing the switching to occur at a higher frequency than when switching from the second tunable variable load to the first tunable variable load, enabling continuous and uninterrupted coverage of a wide frequency range enabled by said tunable loads of the PLL.

7. The PLL of claim 6, wherein the plurality of tunable loads cover in a continuous fashion the frequency range of the high definition multimedia interface (HDMI).

8. The PLL of claim 6, wherein each tunable load allows the PLL to cover a portion of the transmission frequency of HDMI.

* * * * *